US011552126B2

(12) United States Patent
Robin et al.

(10) Patent No.: US 11,552,126 B2
(45) Date of Patent: Jan. 10, 2023

(54) OPTOELECTRONIC DEVICE WITH ELECTRONIC COMPONENTS AT THE LEVEL OF THE REAR FACE OF THE SUBSTRATE AND MANUFACTURING METHOD (71) Applicant: ALEDIA, Grenoble (FR)

(72) Inventors: Ivan-Christophe Robin, Grenoble (FR); Matthieu Charbonnier, Fontaine (FR); Xavier Hugon, Teche (FR); Erwan Dornel, Champagnier (FR)

(73) Assignee: ALEDIA, Grenoble (FR)

( * ) Notice: Subject to any disclaimer, the term of this patent is extended or adjusted under 35 U.S.C. 154(b) by 0 days.

(21) Appl. No.: 16/968,004

(22) PCT Filed: Feb. 1, 2019

(86) PCT No.: PCT/FR2019/050227
§ 371 (c)(1),
(2) Date: Aug. 6, 2020

(87) PCT Pub. No.: WO2019/155146
PCT Pub. Date: Aug. 15, 2019

(65) Prior Publication Data
US 2021/0366979 A1 Nov. 25, 2021

(30) Foreign Application Priority Data
Feb. 6, 2018 (FR) ...................... 18/50975

(51) Int. Cl.
H01L 27/15 (2006.01)
H01L 33/00 (2010.01)
(Continued)

(52) U.S. Cl.
CPC ........ H01L 27/156 (2013.01); H01L 33/0075 (2013.01); H01L 33/06 (2013.01);
(Continued)

(58) Field of Classification Search
None
See application file for complete search history.

(56) References Cited

U.S. PATENT DOCUMENTS 5,789,766 A 8/1998 Huang et al.
9,748,309 B2 8/2017 Von Malm
(Continued)

FOREIGN PATENT DOCUMENTS

EP 3136438 A1 3/2017
FR 3023066 A1 1/2016
(Continued)

OTHER PUBLICATIONS

International Search Report for Application No. PCT/FR2019/050227.
(Continued)

Primary Examiner — Bilkis Jahan
(74) Attorney, Agent, or Firm — Cantor Colburn LLP (57) ABSTRACT An optoelectronic device having a substrate and a plurality of sets of light-emitting diodes where each set includes a plurality of light-emitting diodes, a first lower electrode, a second upper electrode, an electronic component of an electronic circuit formed in a first portion of the substrate, on the side of the face of the substrate that does not bear the light-emitting diodes, and a first conductive means formed through the first portion and electrically connecting a first terminal of the electronic component to one amongst the first and second electrodes. The first conductive means of a given set is electrically-insulated from the first conductive means of the other sets.

27 Claims, 5 Drawing Sheets (51) Int. Cl.
  *H01L 33/06* (2010.01)
  *H01L 33/24* (2010.01)
  *H01L 33/32* (2010.01)
  *H01L 33/38* (2010.01)
  *H01L 33/50* (2010.01)

(52) U.S. Cl.
  CPC ............ *H01L 33/24* (2013.01); *H01L 33/325* (2013.01); *H01L 33/387* (2013.01); *H01L 33/50* (2013.01); *H01L 2933/0016* (2013.01); *H01L 2933/0041* (2013.01)

(56) References Cited

U.S. PATENT DOCUMENTS

| | | | | |
|---|---|---|---|---|
| 10,304,812 | B2* | 5/2019 | Mercier | H01L 33/18 |
| 10,411,161 | B2* | 9/2019 | Dupont | H01L 33/005 |
| 10,418,506 | B2* | 9/2019 | Dupont | H01L 31/167 |
| 10,937,777 | B2* | 3/2021 | Bouvier | H01L 33/24 |
| 2009/0242910 | A1 | 10/2009 | Murofushi et al. | |
| 2014/0367705 | A1 | 12/2014 | Bibl et al. | |
| 2017/0288088 | A1* | 10/2017 | Won Cheol | H01L 33/62 |
| 2017/0373118 | A1* | 12/2017 | Hugon | H01L 33/62 |
| 2019/0326270 | A1 | 10/2019 | Bouvier et al. | |
| 2019/0371779 | A1* | 12/2019 | Yeon | H01L 24/08 |

FOREIGN PATENT DOCUMENTS

| | | |
|---|---|---|
| WO | 2013092304 A1 | 6/2013 |
| WO | 2015044619 A1 | 4/2015 |
| WO | 2017042512 A1 | 3/2017 |
| WO | 2017042513 A1 | 3/2017 |

OTHER PUBLICATIONS

Translation of International Search Report for Application No. PCT/FR2019/050227.
Written Opinion for Application No. PCT/FR2019/050227.

* cited by examiner

OPTOELECTRONIC DEVICE WITH ELECTRONIC COMPONENTS AT THE LEVEL OF THE REAR FACE OF THE SUBSTRATE AND MANUFACTURING METHOD

CROSS REFERENCE TO RELATED APPLICATIONS

This application is a National Stage of PCT Application No. PCT/FR2019/050227 filed on Feb. 1, 2019, which claims priority to French Patent Application No. 18/50975 filed on Feb. 6, 2018, the contents each of which are incorporated herein by reference thereto.

TECHNICAL FIELD

The present invention concerns an optoelectronic device with light-emitting diodes, for example constitutive of a display screen or of a device for projecting images.

BACKGROUND

The invention also concerns a method for manufacturing an optoelectronic device with light-emitting diodes.

In a known manner, an optoelectronic device with light-emitting diodes allows performing the conversion of an electric signal into an electromagnetic radiation.

There are optoelectronic devices, in particular display screens or images projection devices, comprising light-emitting diodes based on semiconductor materials comprising a stacking of semiconductor layers or three-dimensional elements composed mostly of at least one element from the group III and one element from the group V, referred to later on as a III-V compound, in particular gallium nitride (GaN), gallium and indium nitride (GalnN) and gallium and aluminum nitride (GaAIN).

A pixel of an image corresponds to the unitary element of the image displayed by a display screen or projected by a projection device. In the case where the optoelectronic device is a screen for displaying monochrome images, it generally comprises one single light source for the display of each pixel of the image. In the case where the optoelectronic device is a screen for displaying color images or a device for projecting color images, it generally comprises at least three light intensity emission and/or regulation components, also called display sub-pixels, for the display of each image pixel, each emitting a light radiation substantially in one single color (for example, red, green, and blue). The superimposition of the radiations emitted by these three display sub-pixels imparts on the observer the colored feeling corresponding to the pixel of the displayed image. In this case, by display pixel, it should be understood the set formed by the three sub-pixels used for the display of one image pixel.

In general, each sub-pixel is constituted by a set composed by one or several light-emitting diode(s), an optoelectronic device thus comprising a plurality of such sets of light-emitting diodes for constituting the different sub-pixels.

In order to manufacture each pixel, a first solution consists in providing a set of diodes adapted to emit red light, another set of diodes adapted to emit green light and another set adapted to emit blue light. But this type of design requires the manufacture of the diodes of a given color on the same substrate, which is cut afterwards in order to delimit individual devices. Each pixel is then obtained by reconstruction in order to associate the individual devices so as to obtain the three colors.

An alternative solution consists in providing for all of the diodes of one pixel being adapted to emit in a given color, the obtainment of the sub-pixels emitting in the two other colors being obtained through color converters.

Afterwards, the different sub-pixels thus obtained by reconstruction or using color converters are disposed within a case so as to protect the light-emitting diodes, which case is generally fastened to a support, such as a printed circuit.

In particular, it may be desirable to associate to each set of light-emitting diodes, a control electronic circuit whose function consists in controlling the light-emitting diodes of this set, for example in order to regulate the emission of each sub-pixel of each image pixel. More generally, it consists, for example, of a circuit for controlling the power supply of the light-emitting diodes, a circuit for protecting the light-emitting diodes against electrostatic discharges or a circuit for detecting the temperature of the light-emitting diodes.

These circuits, which may comprise a few transistors (for example in an amount comprised between 2 and 100) and possibly some capacitors (in an amount comprised between 0 and 6) for each light-emitting diode, may be connected to the light-emitting diodes by a hybridization technique. In this technique, the electronic circuits are first manufactured on a second substrate, separately from the optoelectronic device, and then assembled to the optoelectronic device, for example by being fastened to the support and connected to the case.

This known technique poses a problem because the bulk due to the electronic circuits may be considerable. It generates a high cost because of the need for using a second substrate. It requires providing for a hybridization process having a step corresponding to the step of the matrix of the light-emitting diodes. In addition to the manufacture of the optoelectronic device, the method comprises distinct steps of manufacturing the electronic circuits and steps of connecting the electronic circuits to the optoelectronic device. These steps generate manufacturing costs.

Another solution consists in embedding the components of the electronic circuits over the face of the substrate that bears the light-emitting diodes, for example in the same way as the solution described in the document WO2015/044619A1 on the name of the Applicant. But this solution induces a substantial loss of space on the side of the light-emitting diodes because of the space occupied by the implantation of the electronic circuits between the light-emitting diodes. This loss of space results in this technique not being perfectly suited to the construction of a display screen where the best possible resolution is commonly desired.

Resorting to electronic circuits using thin film transistors, known in the concerned field under the name «TFT», does not allow solving these problems because transistors of this kind cannot be associated to small-sized pixels.

BRIEF SUMMARY

The present invention aims at solving all or part of the aforementioned drawbacks.

In this context, there is a need to provide a solution meeting at least one of the objectives listed hereinafter:
reduce the bulk of the optoelectronic device;
simplify manufacture and reduce costs;

promote the obtainment of a good resolution conferred by the optoelectronic device and enable the use of small-sized pixels.

At least one of these objectives may be achieved thanks to the provision of an optoelectronic device comprising a substrate delimiting a first face and a second face opposite to one another along the thickness of the substrate, and a plurality of sets of light-emitting diodes where the light-emitting diodes of a given set are electrically associated together and each set of light-emitting diodes comprises:

a plurality of light-emitting diodes arranged, on the side of the first face of the substrate, over a corresponding first portion of the substrate, each light-emitting diode comprising semiconductor elements including a first doped portion, an active portion and a second doped portion;

a first lower electrode in contact with the first doped portions of all of the light-emitting diodes of the set;

a second upper electrode in contact with the second doped portions of all of the light-emitting diodes of the set, the second upper electrode being electrically-insulated with respect to the first lower electrode and comprising an upper conductive electrode portion covering at least one portion of each light-emitting diode of said set so as to contact with each diode;

an electronic component of an electronic circuit formed in the first portion of the substrate, on the side of the second face of the substrate;

a first conductive means formed through the first portion and electrically connecting a first terminal of the electronic component to one amongst the first and second electrodes, the first conducive element of a given set of light-emitting diodes being electrically-insulated from the first conductive means of the other sets of light-emitting diodes.

Some preferred but non-limiting aspects of this optoelectronic device are as follows.

The substrate is monolithic.

The second face of the substrate is a free surface.

The substrate delimits a box at the level of each first portion of the substrate, the conductivity of the box being opposite to that of the substrate, the box being formed in the second face of the substrate and the electronic component of an electronic circuit being formed at least partially in the box so as to be in direct contact with the substrate.

The substrate is composed by at least one semiconductor material adapted to serve as a base material for the formation of at least one portion of the electronic component of an electronic circuit.

Said at least one portion of said electronic component is formed from the semiconductor material of the substrate in the first portion of the substrate, on the side of the second face of the substrate.

Said at least one portion of said electronic component is an active portion.

Each electronic component comprises a second terminal distinct and insulated from the first terminal and the optoelectronic device comprises a second conductive means connecting the second terminals of the electronic components of the plurality of sets of light-emitting diodes to the other one amongst the first and second electrodes.

The second conductive means comprises a conductive element crossing the substrate by extending from the first face to the second face outside the first portions associated to all of the sets of light-emitting diodes and a conductive layer arranged on the side of the second face.

The conductive element is electrically connected to the second upper electrode of the sets of light-emitting diodes if the first conductive means of each set of light-emitting diodes is in contact with the first lower electrode of said set of light-emitting diodes, or to the first lower electrode of the sets of light-emitting diodes if the first conductive means of each set of light-emitting diodes is in contact with the second upper electrode of said set of light-emitting diodes.

The optoelectronic device comprises an optoelectronic circuit including distinct elementary electronic circuits connected together, where each elementary electronic circuit comprises, on the one hand, one of the sets of light-emitting diodes and, on the other hand, a control electronic circuit ensuring control of the light-emitting diodes of this set of light-emitting diodes, this control electronic circuit being arranged on the side of the second face of the substrate and the electronic component of this set of light-emitting diodes forming an integral part of said control electronic circuit.

The control electronic circuit of the light-emitting diodes of one set of light-emitting diodes is configured so as to fill at least one of the following functions: control of the power supply of said light-emitting diodes, a protection of said light-emitting diodes against electrostatic discharges, a memory, a detection of the temperature of said light-emitting diodes.

The electronic component is selected from the group comprising a diode, a Zener diode, an avalanche diode, a bipolar transistor, a metal-oxide-semiconductor field-effect transistor, a resistor, a metal-oxide-semiconductor capacitor, a metal-insulator-metal capacitor, a thyristor, a varactor, a volatile memory and a non-volatile memory.

The upper conductive electrode layer which covers at least one portion of the light-emitting diodes so as to contact therewith is formed in a material at least partially transparent to the light emitted by the light-emitting diodes covered thereby.

At the level of each set of light-emitting diodes, the second upper electrode comprises a conductive layer covering at least one portion of the upper conductive electrode layer and arranged around the light-emitting diodes.

The semiconductor elements of the light-emitting diodes of each set have a wire-like, conical or frustoconical shape.

At the level of each set of light-emitting diodes, the first portion of the substrate constitutes the first lower electrode and the first conductive means, the first face of the substrate being in contact with the first doped portions of all of the light-emitting diodes of this set and the electronic component being in contact with the substrate at the level of its second face so that the electrical connection between the first terminal of the electronic component and the first doped portions of all of the light-emitting diodes of this set is ensured by the first portion.

The first conductive means of a given set of light-emitting diodes which connects one amongst the first and second electrodes to the first terminal of the electronic component of this set is electrically-insulated from the substrate and comprises an electrically-conductive via extending from the second face up to the first face of the substrate and electrically connected to the electrode to which the first conductive means is connected.

For each set of light-emitting diodes, the first lower electrode comprises at least one lower conductive electrode layer formed on the first face of the substrate and in contact with the first doped portions of all of the light-emitting diodes of this set.

The invention also covers a method for manufacturing an optoelectronic device comprising the following steps of:

(a) providing a substrate delimiting a first face and a second face opposite to one another along the thickness of the substrate;

(b) forming a plurality of sets of light-emitting diodes where the light-emitting diodes of a given set are electrically associated together, during which step (b) the formation of each set of light-emitting diodes comprises the formation of a plurality of light-emitting diodes, on the side of the first face of the substrate, over a corresponding first portion of the substrate, the formation of each light-emitting diode comprising a step of forming semiconductor elements including a first doped portion, an active portion and a second doped portion;

(c) forming, for each set of light-emitting diodes, a first lower electrode in contact with the first doped portions of all of the light-emitting diodes of this set;

(d) forming, for each set of light-emitting diodes, a second upper electrode in contact with the second doped portions of all of the light-emitting diodes of this set, the second upper electrode being electrically-insulated with respect to the first lower electrode and comprising a step of forming an upper conductive electrode layer covering at least one portion of each light-emitting diode of this set so as to contact with each light-emitting diode;

(e) forming an electronic component of an electronic circuit in the first portion of the substrate, on the side of the second face of the substrate;

(f) supplying a first conductive means formed through the first portion and adapted to electrically connect a first terminal of the electronic component formed at step (e) to the first lower electrode formed at step (c) or to the second upper electrode formed at step (d), step (f) being carried out so that the first conductive means of a given set of light-emitting diodes is electrically-insulated from the first conductive means of the other sets of light-emitting diodes.

Some preferred but non-limiting aspects of this manufacturing method are as follows.

Step (f) is carried out at least partially before step (b).

Step (f) is carried out at least partially after step (c) and after step (d).

Step (e) is carried out at least partially after step (b).

Step (e) is carried out at least partially after step (c) and after step (d).

Step (a) comprises a step (h) consisting in reducing the thickness of the substrate on the side opposite to the first face, the substrate comprising, after step (h), the second face opposite to the first face and step (h) is carried out before step (e).

The method comprises a step (i) consisting in forming at least one color converter covering the second upper electrode of at least one set of light-emitting diodes and step (e) is carried out at least partially after step (i).

The method comprises a step (g) consisting in forming an encapsulation layer covering the second electrode and step (e) is carried out at least partially after step (g).

Step (e) is carried out at a temperature lower than 650° C.

The substrate is monolithic and composed by at least one semiconductor material adapted to serve as a base material for the formation of at least one portion of the electronic component, the method including a sub-step (e1) of step (e) consisting in the formation of said at least one portion of said electronic component from the semiconductor material of the substrate in the first portion of the substrate, on the side of the second face of the substrate.

Said at least one portion of said electronic component is an active portion.

The second face is a free surface at step (e).

BRIEF DESCRIPTION OF THE DRAWINGS

The invention will be better understood using the following description of particular embodiments of the invention provided as non-limiting examples and represented in the appended drawings, in which.

DETAILED DESCRIPTION

In the figures and in the following description, the same reference numerals represent identical or similar elements. In addition, the different elements are not represented to scale so as to enhance clarity of the figures.

According to a first aspect, the invention concerns an optoelectronic device 10 comprising a substrate 11 delimiting a first face 12 and a second face 13 opposite to one another along the thickness E of the substrate 11. According to another aspect, the invention concerns a method for manufacturing such an optoelectronic device 10.

Figure 1:
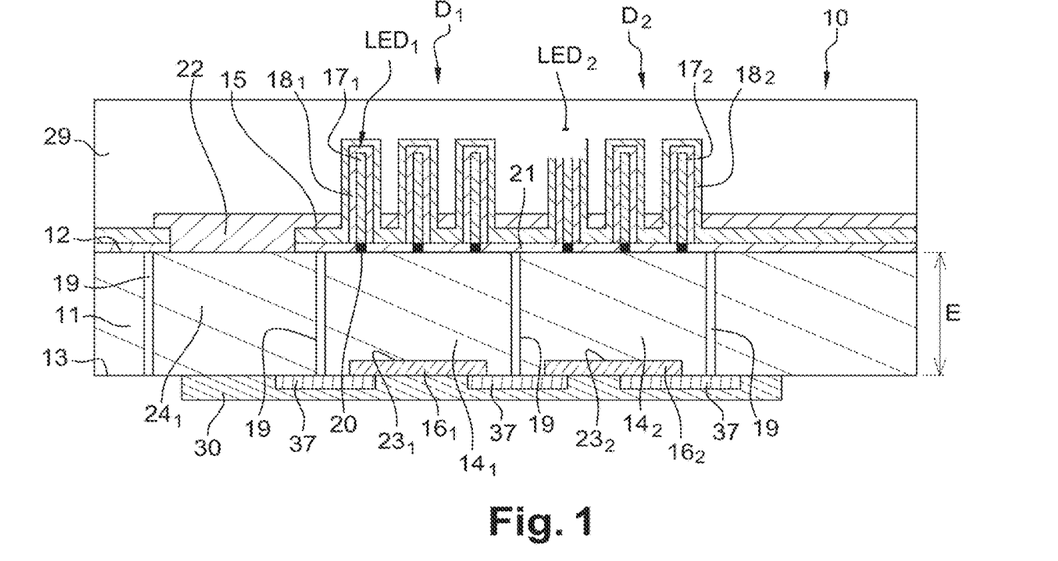
FIGS. 1 and 2 are partial, respectively sectional and bottom, views of a first embodiment of an optoelectronic device according to the invention.
Figure 2:
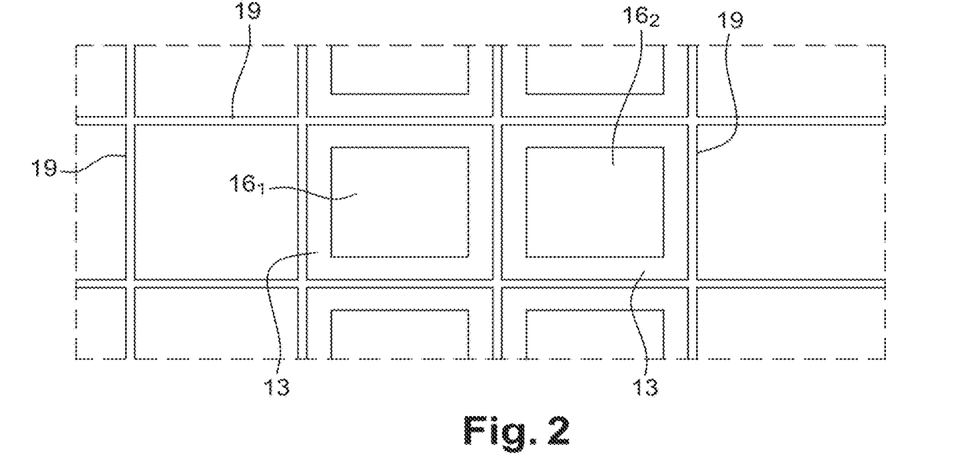
Figure 3:
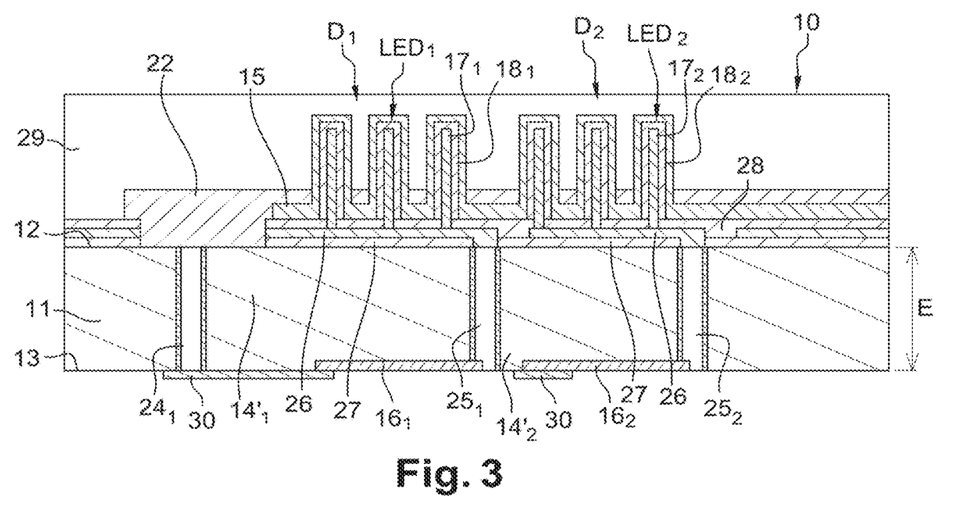
FIGS. 3 and 4 are partial, respectively sectional and top, views before the formation of the second upper electrodes, of a second embodiment of an optoelectronic device according to the invention.
Figure 4:
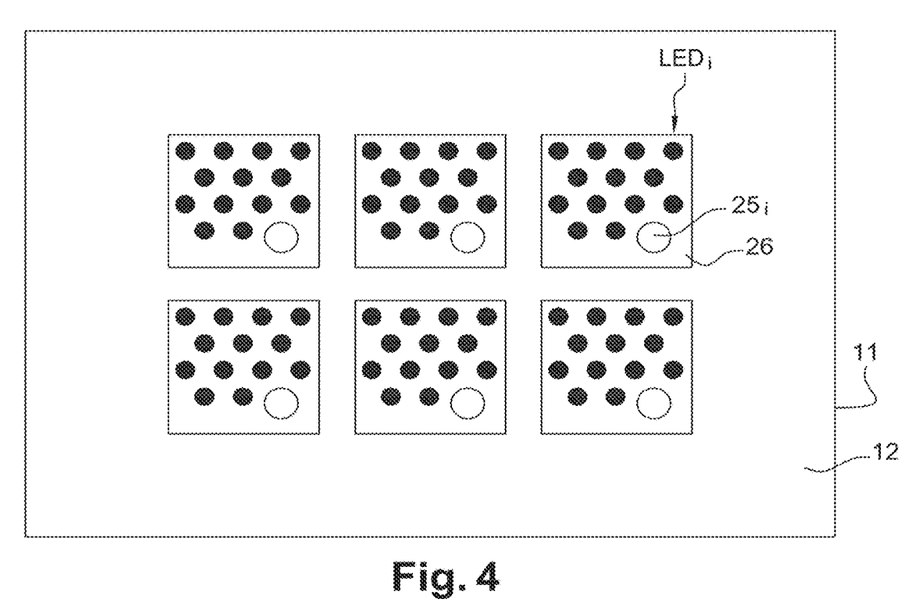
Figure 5:
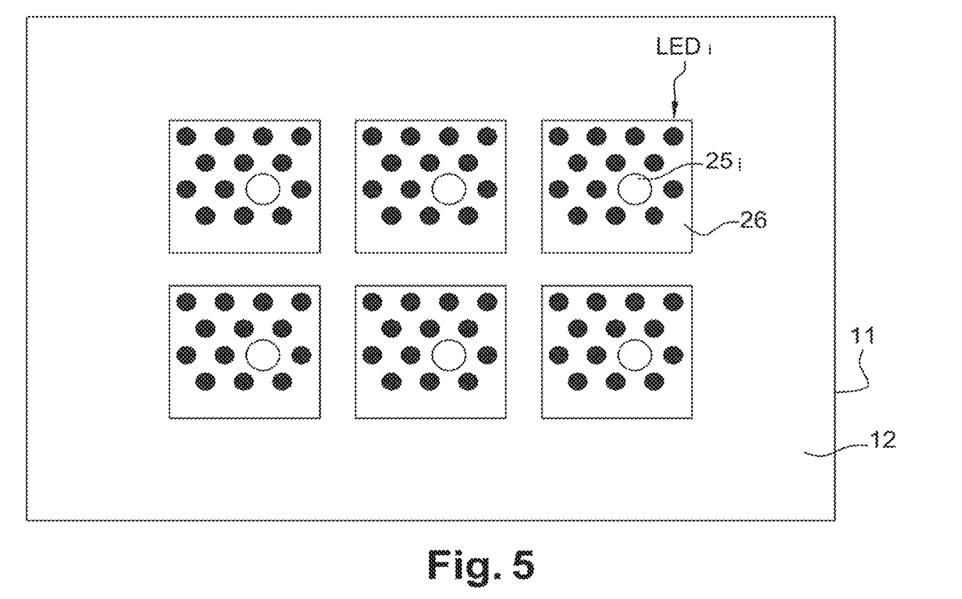
FIG. 5 illustrates a variant of FIG. 4.
Figure 6:
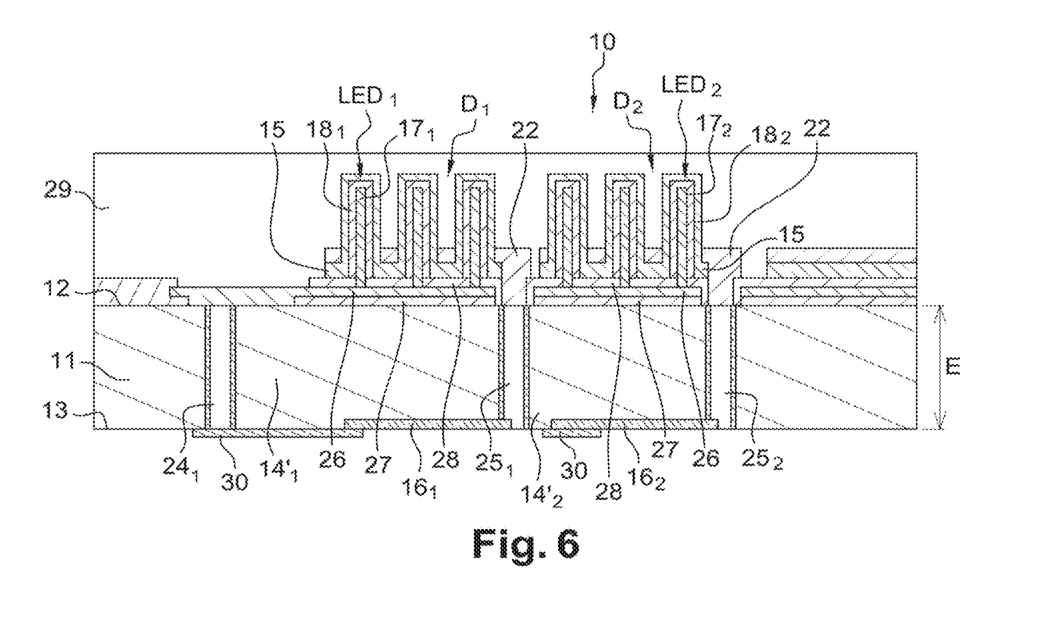
FIGS. 6 and 7 are partial, respectively sectional and top, views of a third embodiment of an optoelectronic device according to the invention.
Figure 7:
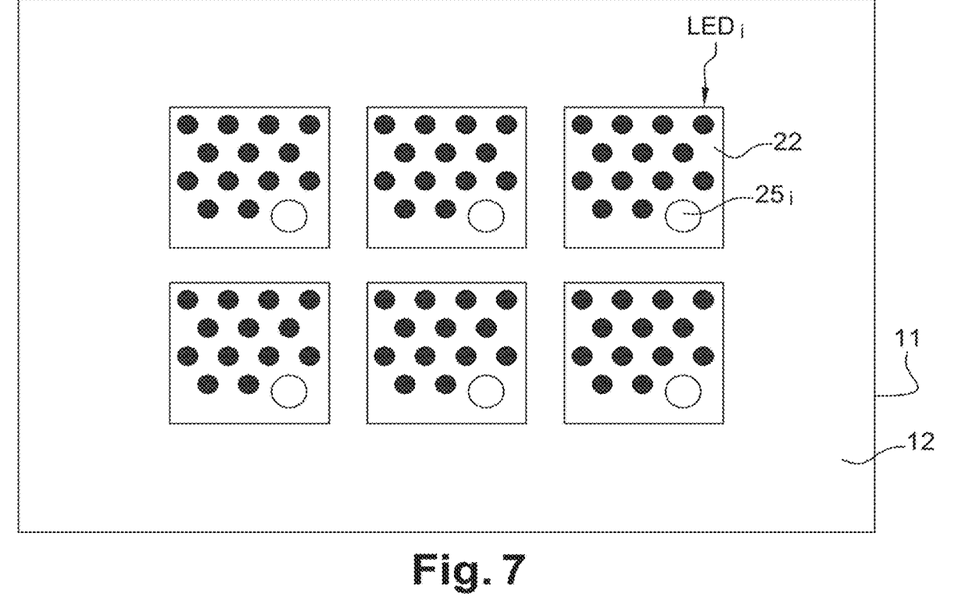

FIGS. 1 and 2 refer to a first embodiment of the optoelectronic device 10. FIGS. 3 to 5 concern a second embodiment of the optoelectronic device 10 and FIGS. 6 and 7 represent a third embodiment of the optoelectronic device 10. These different embodiments will be detailed hereinafter. Similarly, the different steps of the manufacturing method will be detailed later on, as well as the different variants of implementation of the manufacturing method.

The embodiments described later on concern optoelectronic devices a particularly targeted application thereof is the supply of a screen for displaying images or a device for projecting images.

Referring to the first embodiment of FIG. 1, the substrate 11 may be at least partially formed in a conductive or highly-doped semiconductor material so as to have good electric conductivity properties, for example constituted by silicon, preferably monocrystalline. It may also be formed by sapphire and even by a III-V semiconductor material, for example GaN. Alternatively, it may consist of a «Silicon On Insulator» or «SOI» type substrate. Alternatively, as explained later on, referring to the second and third embodiments of FIGS. 3 and 6 respectively, the substrate 11 may be formed in a semiconductor or electrically-insulating material. In one example, illustrated in FIGS. 1, 3, 6, 8, 9, the substrate 11 is monolithic, that is to say it is formed in one-piece and is not formed by an assembly of several different substrates electrically connected together by a conductive material.

Preferably, the second face 13 of the substrate 11 is a free surface as illustrated in FIGS. 1, 3, 6, 8 and 9. In other words, the second face 13, before the formation of a box $23_i$ or of a portion of the electronic component of an electronic circuit $16_i$ is not in direct contact with a layer covered thereby. In one example, the substrate 11 may be naturally composed by an oxide layer formed therewithin from its outer surface, for example the second face 13, subsequently to contact with ambient air. This same oxide layer may be intentionally formed to protect or insulate the substrate 11. This oxide layer being formed from the atomic elements of the substrate 11, it should be understood that in the terms «the second face 13, before the formation of a box $23_i$ or of a portion of the electronic component of an electronic circuit $16_i$ is not in direct contact with a layer covered thereby», the oxide layer formed at the surface of the substrate is part of the substrate 11 and therefore this oxide layer shall not be understood as a layer covering the substrate 11 by direct contact. The same applies to any layer formed from atomic elements comprised in the substrate, for example SiC in a silicon substrate.

In all of the represented embodiments, the optoelectronic device 10 comprises a plurality of sets $D_i$ of light-emitting diodes $LED_i$ where the light-emitting diodes $LED_i$ of a given set $D_i$ are electrically associated together. The index i associated to each set of light-emitting diodes is a natural number comprised between 1 and n where n is the total number of sets of light-emitting diodes. In particular, each set $D_i$ is intended to constitute a sub-pixel and comprises, to this end, a plurality of light-emitting diodes $LED_i$ arranged, on the side of the first face 12 of the substrate 11, over a corresponding first portion of the substrate 11. Each pixel of the optoelectronic device 10 is constituted by the combination of at least three sub-pixels adapted to emit directly, or indirectly through at least two different light converters, three lights at different wavelengths, for example respectively blue, green and red lights. The first portion, denoted $14_i$, corresponds to each first portion of the substrate 11 where the light-emitting diodes are formed in the particular case where the substrate 11 is electrically-conductive. The first portion, denoted $14'_i$, corresponds to each first portion of the substrate 11 where the light-emitting diodes are formed in the particular case where the substrate 11 is semiconductor or electrically-insulating.

The number of light-emitting diodes $LED_i$ that each of the sets $D_i$ comprises may vary for example according to the dimension of the light-emitting diodes or the resolution intended for the pixelation. This number may be different from one set to another, and is for example comprised between 1 and 1000. The surface occupied by each sub-pixel in top or bottom view may vary from 1 micron by 1 micron to several mm² and typically from 5 to 100 µm².

For exclusively illustrative purposes, but without any limitation, each of FIGS. 1, 3 and 6 represents only a first set $D_1$ comprising three light-emitting diodes $LED_1$ and a second set $D_2$ comprising three light-emitting diodes $LED_2$. Only two sets $D_1$ and $D_2$ being present in these figures, these schematically represent only the presence of two first portions $14'_1$, $14'_2$ in the first embodiment of FIG. 1 or $14'_1$, $14'_2$ in the embodiments of FIGS. 3 and 6, the total number of which is actually equal to the number of sets $D_i$.

Each light-emitting diode $LED_i$ comprises semiconductor elements including a first doped portion, an active portion and a second doped portion. The semiconductor elements may be arranged according to a two-dimensional layout (not represented) or, as represented, in a three-dimensional manner, according to micrometric or nanometric dimensions. Preferably, the semiconductor elements of the light-emitting diodes $LED_i$ of each set $D_i$ have a wire-like, conical or frustoconical shape.

In the following description and in the figures, the embodiments are described for core-shell type three-dimensional light-emitting diodes $LED_i$. Nonetheless, these embodiments may be implemented indifferently for three-dimensional light-emitting diodes $LED_i$ having an axial structure where the first doped portion, the active portion and the second doped portion are stacked according to a direction transverse to the plane of the substrate 11.

In general, each set $D_i$ of light-emitting diodes $LED_i$ also comprises a first lower electrode in contact with the first doped portions of all of the light-emitting diodes $LED_i$ of this set $D_i$ and a second upper electrode in contact with the second doped portions of all of the light-emitting diodes $LED_i$ of this set $D_i$.

The second upper electrode is electrically-insulated with respect to the first lower electrode and comprises an upper conductive electrode layer 15 covering at least one portion of each light-emitting diode $LED_i$ of the concerned set $D_i$ so as to contact with a light-emitting diode $LED_i$.

As represented, each light-emitting diode $LED_i$ comprises a wire $17_i$ forming the first doped portion $17_i$, whether of the N-type or P-type, extending transversely to the plane of the first face 12, and a shell $18_i$ covering at least the upper portion of the wire $17_i$. The shell $18_i$ may comprise a stacking of several layers of semiconductor materials, in particular at least one active layer covering at least the upper portion of the wire $17_i$, one intermediate layer forming the second doped portion and covering the active layer, and possibly one link layer covering the intermediate layer and, in turn, covered with the upper conductive electrode layer 15.

As example, the wires $17_i$ may be formed, at least partially, from semiconductor materials composed mostly of a III-V compound, for example III-N compounds. Examples of the group Ill include gallium, indium or aluminum. Examples of the III-N compounds are GaN, AlN, InGaN or AlInGaN. Other elements from the group V may also be used, for example, phosphorus, arsenic or antimony. In general, the elements in the III-V compound may be combined at different molar fractions. It should be highlighted that the wires $17_i$ may indifferently be formed from semiconductor materials composed mostly of a II-VI compound. The dopant may be selected, in the case of a III-V compound, from the group including a P-type dopant from the group II, for example magnesium, zinc, cadmium or mercury, a P-type dopant from the group IV for example carbon, or a N-type dopant from the group IV, for example silicon, germanium, selenium, sulfur, terbium or tin.

The cross-section of the wires $17_i$ may have different shapes such as, for example, an oval, circular or polygonal (for example square, rectangular, triangular, hexagonal) shape.

The active layer is the layer from which most of the radiation supplied by the light-emitting diode $LED_i$ is emitted. It may include means for confining the electric-charge carriers, such as quantum wells. For example, it is constituted by an alternation of GaN and InGaN layers. The GaN layers may be doped. Alternatively, the active layer is constituted by one single InGaN layer.

The intermediate layer, P-type doped if the wires $17_i$ are N-type doped or N-type doped if the wires $17_i$ are P-type doped, may correspond to a semiconductor layer or to a stacking of semiconductors layers enabling the formation of a P-N or P-I-N junction.

The link layer may correspond to a semiconductor layer or to a stacking of semiconductor layers and enables the formation of an ohmic contact between the intermediate layer and the second electrode.

In general, each set $D_i$ of light-emitting diodes $LED_i$ also comprises an electronic component of an electronic circuit $16_i$ described later on formed in the first portion $14_i$, $14'_i$ of the substrate 11, on the side of the second face 13 of the substrate 11, and a first conductive means formed through the first portion $14_i$, $14'_i$ of the substrate 11 from the second face 13 up to at least the first face 12 and electrically connecting a first terminal of the electronic component to the first electrode or to the second electrode.

By «formed in the first portion $14_i$, $14'_i$ of the substrate 11», and as illustrated in FIGS. 1, 3, 6, 8 and 9, it should be understood «formed in the first portion $14_i$, $14'_i$ of the substrate 11 by modifying at least partially the electric state of the substrate, for example by making it more conductive or else, for example in the case where the substrate 11 is doped, by modifying the doping thereof into a different doping type or else by modifying the concentration of dopants».

Care shall be taken to guarantee that the first conductive means of a given set $D_i$ of light-emitting diodes $LED_i$ is electrically-insulated from the first conductive means of the other sets $D_j$ of light-emitting diodes $LED_j$.

The arrangement of the electronic components on the side of the second face 13, that is to say on the side opposite to the face over which the light-emitting diodes $LED_i$ of the optoelectronic device 10 are arranged, avoids wasting space on the side of the first face 12, thereby guaranteeing a high pixel density and an excellent resolution where needed.

The electronic components are obtained directly on the substrate 11 bearing the light-emitting diodes $LED_i$, thereby eliminating the need for hybridization techniques of the prior art, and allowing reducing costs and considerably simplifying the manufacture of the optoelectronic device 10.

The embodiments of the different FIGS. 1 to 7 differ from one another in particular in the manner in which, for each set $D_i$ of light-emitting diodes $LED_i$, the first lower electrode and the first conductive means are constituted.

In the embodiment of FIGS. 1 and 2, the substrate 11 is such that at the level of each set $D_i$ of light-emitting diodes $LED_i$, the first portion $14_i$ of the substrate 11, electrically conductive, constitutes both the first lower electrode and the conductive means. The first face 12 of the substrate 11 is in contact with the first doped portions of all of the light-emitting diodes $LED_i$ of this set $D_i$ and the electronic component is in contact with the substrate 11 at the level of its second face 13 so that the electrical connection between the first terminal of the electronic component and the first doped portions of all of the light-emitting diodes $LED_i$ of this set $D_i$ is ensured by the first portion $14_i$.

For this purpose, it is provided in particular for the substrate 11 being conductive or highly-doped semiconductor so as to lower the electrical resistivity down to a resistivity close to that of metals, preferably lower than a few mohm·cm. The substrate 11 may be a highly-doped semiconductor substrate with a concentration of dopants comprised between $5*10^{16}$ atoms/cm$^3$ and $2*10^{20}$ atoms/cm$^3$ yet without that being restrictive, typically between $1*10^{19}$ atoms/cm3 and $2*10^{20}$ atoms/cm$^3$. At the beginning of the optoelectronic device 10 manufacturing process, the substrate 11 may have a thickness comprised, for example, between 275 microns and 1500 microns. Once the optoelectronic device 10 is made, after a thinning step (h) described in more details later on, the substrate 11 has a thickness, denoted «E», comprised, for example, between 1 and 100 microns. In the case of a silicon substrate 11, boron or indium are examples of P-type dopants whereas phosphorus, arsenic or antimony are examples of N-type dopants.

In the embodiment of FIGS. 1 and 2, the substrate 11 embeds across its thickness E electrically-insulating elements 19 extending from the first face 12 to the second face 13 of the substrate 11 and delimiting in pairs the first portions $14_i$ of the substrate 11 associated to the sets $D_i$ of light-emitting diodes $LED_i$. The first portions $14_i$ of the substrate 11 are electrically-insulated from one another thanks to the electrically-insulating elements 19 so as to avoid, in practice, electrical contacts between the first lower electrodes of different sets $D_i$ of light-emitting diodes $LED_i$.

The electrically-insulating elements 19 may comprise trenches each extending over the entire thickness E of the substrate 11 and filled with an electrically-insulating material, for example an oxide, in particular silicon oxide, or an insulating polymer. Alternatively, the walls of each trench are covered with an insulating layer, the remainder of the trench being filled with a semiconductor or conductive material, for example polycrystalline silicon. According to another variant, the electrically-insulating elements 19 comprise regions doped with a polarity type opposite to the substrate 11. As example, each trench has a width larger than 1 micron. Two adjacent trenches delimit the corresponding first portion $14_i$ therebetween. As shown in FIG. 2, the electrically-insulating elements 19 comprise a first series of such trenches directed according to a lateral direction of the substrate 11 and thus stepped along a longitudinal direction of the substrate 11 and a second series of such trenches directed according to the longitudinal direction of the substrate 11 and thus stepped along the lateral direction of the substrate 11. This allows reaching a matrix-like layout of the sets $D_i$ of light-emitting diodes $LED_i$ in the plane of the substrate 11 and with an identical distribution, on the side of the second face 13, of all of the electronic components associated to the different sets $D_i$ of light-emitting diodes $LED_i$.

It is herein specified that such electrically-insulating elements 19 may quite possibly be implemented even in the case according to the second and third embodiments where the substrate 11 is formed in a semiconductor or electrically-insulating material.

As example, each wire $17_i$ may be obtained by growth from a nucleation pad 20 promoting the growth of the wires $17_i$, each nucleation pad 20 being, in turn, in contact with the first face 12 of the substrate 11 in order to guarantee the first lower electrode function of the first corresponding portion $14_i$ of the substrate 11. A treatment may be provided for to protect the sidewalls of the nucleation pads 20 and the areas of the first face 12 that are not covered with the nucleation pads 20 to prevent the growth of the wires $17_i$ over the sidewalls of the nucleation pads 20 and over the areas of the first surface 12 that are not covered with the nucleation pads 20. This treatment may comprise the formation of an insulating layer 21 over the sidewalls of the nucleation pads 20 and, at the level of each first portion $14_i$, over the areas of the first face 12 that are not covered with the nucleation pads 20. A way for reaching this result consists in providing for the insulating layer 21 being provided with holes at the locations intended to be equipped with nucleation pads 20, so as to form the nucleation pads 20 in these holes delimited by the insulating layer 21, and then achieve the growth of the wires $17_i$ from the nucleation pads 20. Alternatively, the nucleation pads 20 are formed at first before being covered with the insulating layer 21, and then holes are formed in the insulating layer 21 above the nucleation pads 20 in order to be able to proceed afterwards with the growth of the wires $17_i$. The insulating layer 21 thus formed over the first face 12 of the substrate 11 at the level of the different first portions $14_i$ is also capable of electrically insulating, for each set $D_i$ of light-emitting diodes $LED_i$, the first lower electrode with respect to the upper conductive electrode layer 15 belonging to the second upper electrode.

As example, the material including the nucleation pads 20 may be a transition metal of the column IV, V or VI of the periodic table of elements or a nitride, a carbide or a boride of a transition metal of the column IV, V or VI, or a combination of these compounds.

The insulating layer 21 may be a dielectric material, for example silicon oxide, silicon nitride, silicon oxynitride, aluminum oxide, hafnium oxide, or diamond. For example, this insulating layer 21 has a thickness comprised between 5 nm and 800 nm.

The upper conductive electrode layer 15 which covers at least one portion of the light-emitting diodes $LED_i$ so as to contact therewith may advantageously be formed in a material at least partially transparent to the light emitted by the light-emitting diodes $LED_i$ covered thereby. The selection of this material at the level of each set $D_i$ of light-emitting diodes $LED_i$ may take into account the wavelengths of the lights emitted by the light-emitting diodes $LED_i$ of the different sets $D_i$.

In general, the upper conductive electrode layer 15 is adapted to polarize the active layer of the light-emitting diodes $LED_i$ and to let at least one portion of the electromagnetic radiation emitted by the light-emitting diodes $LED_i$ pass. For example, the material of this layer 15 is «Indium Tin Oxide» or «ITO», zinc oxide doped with aluminum, gallium or indium, or graphene. As example, the upper conductive electrode layer 15 has a thickness comprised between 5 nm and 200 nm.

In addition, at the level of each set $D_i$ of light-emitting diodes $LED_i$, the second upper electrode preferably comprises a conductive layer 22 covering at least one portion of the upper conductive electrode layer 15 and arranged around the light-emitting diodes $LED_i$ of this set $D_i$. Preferably, this conductive layer 22 corresponds to a metallic layer, for example made of aluminum, copper, gold, ruthenium or silver, or a stacking of metallic layers, for example titanium-aluminum, silicon-aluminum, titanium-nickel-silver, copper or zinc. Such a conductive layer 22 only present between the light-emitting diodes $LED_i$ allows reducing the resistive losses when current flows. It also serves as a reflector to send back towards the outside the rays emitted by the light-emitting diodes $LED_i$ in the direction of the substrate 11.

In each of the three embodiments of FIGS. 1 to 7, each electronic component comprises a second terminal distinct and insulated from its first terminal and the optoelectronic device 10 comprises a second conductive means crossing the substrate 11 and connecting the second terminals of the electronic components of the plurality of sets $D_i$ of light-emitting diodes $LED_i$ to the other one amongst the first and second electrodes, that is to say to the electrode that is not connected to the aforementioned first conductive means. In particular, the second conductive means is at least partially formed outside the first portions $14_i$, $14'_i$ of the substrate 11 and over the second face 13 of the substrate 11. In particular, the second conductive means may comprise a conductive element $24_i$ formed outside the first portions $14_i$ associated to all of the sets $D_i$ of light-emitting diodes $LED_i$, extending from the first face 12 to the second face 13 of the substrate 11. The conductive element $24_i$ is electrically connected either to the second upper electrode of the sets $D_i$ of light-emitting diodes $LED_i$ if the first conductive means of each set $D_i$ of light-emitting diodes $LED_i$ is in contact with the first lower electrode of said set $D_i$ of light-emitting diodes $LED_i$, or to the first lower electrode of the sets $D_i$ of light-emitting diodes $LED_i$ if the first conductive means of each set $D_i$ of light-emitting diodes $LED_i$ is in contact with the second upper electrode of said set $D_i$ of light-emitting diodes ($LED_i$).

The presence of such a conductive element $24_i$ is advantageous to allow connecting, via a proper conductive layer 30 arranged on the side of the second face 13 of the substrate 11, the second terminals of the electronic components to one another. Besides, in the case of an arrangement of several conductive elements $24_i$ where each is in contact with the second upper electrode of one or several set(s) $D_i$ of light-emitting diodes $LED_i$, it is possible to connect, via the conductive layer 30, these second upper electrodes to one another thanks to connectors arranged on the side of the second face 13 of the substrate 11 and connecting the conductive elements $24_i$ to one another. This advantageously allows getting rid of the need for manufacturing a second upper electrode common to all of the light-emitting diodes $LED_i$ of the optoelectronic device 10. For example, assuming planar shaped light-emitting diodes $LED_i$, then it becomes possible to avoid having to cover all of them with an opaque metallic anode. On the contrary, it is possible to provide for one anode in several portions respectively arranged around the planar light-emitting diodes $LED_i$ and connected to one another through the conductive elements $24_i$ and the conductive layer 30 on the side of the second face 13.

Hence, it should be understood that the second conductive means is constituted by the combination of at least one of the conductive elements $24_i$ and of the conductive layer 30.

In the first embodiment of FIGS. 1 and 2, each of the conductive elements $24_i$ is formed by a portion of the substrate 11 distinct from the first portions $14_i$ over which the light-emitting diodes $LED_i$ are formed and delimited by the previously-described electrically-insulating elements 19. The conductive elements $24_i$ of the substrate 11 are electrically-insulated from one another and are insulated with respect to the different first portions $14_i$ of the substrate 11 thanks to a proper arrangement of the trenches constitutive of the electrically-insulating elements 19. In this first embodiment where the first lower electrode of each set $D_i$ of light-emitting diodes $LED_i$ is in contact with the first conductive means of this set $D_i$, both being concretely constituted by the corresponding first portion $14_i$ of this set $D_i$ as previously explained, the second upper electrode of each set $D_i$ of light-emitting diodes $LED_i$ is electrically connected to a corresponding conductive element $24_i$. More specifically, the conductive elements $24_i$ are in contact with the conductive layer 22 through a hole formed in the insulating layer 21 and in the upper conductive electrode layer 15. In FIG. 1, in order to avoid an electrical contact through the conductive layer 30 between the conductive element $24_i$ and the first portions $14_i$ which are conductive, an electrically-insulating layer 37 is arranged organized in a proper way so as to ensure an electrical insulation as a complement to the electrically-insulating elements 19.

Unlike the embodiment of FIGS. 1 and 2, the following two embodiments, referring respectively to FIGS. 3 to 5 and 6 to 7, are such that the first lower electrode and the first conductive means, for each set $D_i$ of light-emitting diodes $LED_i$, are obtained by means other than the substrate 11 itself. Indeed, in FIGS. 3 to 7, the first conductive means of a given set $D_i$ of light-emitting diodes $LED_i$ which connects one amongst the first and second electrodes to the first terminal of the electronic component of this set $D_i$ is electrically-insulated from the substrate 11 and comprises an electrically-conductive via $25_i$ extending from the second face 13 up to the first face 12 of the substrate 11 and electrically connected to the electrode to which the first conductive means is connected.

In the two embodiments of FIGS. 3 to 7, in contrast with the embodiment of FIGS. 1 and 2, the substrate 11 may advantageously be formed in an insulating material or in a lowly-doped semiconductor material, which has the advantage of considerably facilitating the formation of the electronic component in the case where the latter comprises a transistor, in particular for the manufacture of a transistor with a conduction channel therewithin. Indeed, the manufacture of such a transistor would be quite delicate with a conductive or highly-doped semiconductor substrate 11 as is the case in the first embodiment of FIGS. 1 and 2.

Unlike the first embodiment of FIGS. 1 and 2 where the light-emitting diodes $LED_i$ are in electrical contact directly with the substrate 11, each of the two embodiments of FIGS. 3 to 7 provides for the first lower electrode comprising, for each set $D_i$ of light-emitting diodes $LED_i$, at least one lower conductive electrode layer 26 formed directly or indirectly over the first face 12 of the substrate 11 and in contact with the first doped portions of all of the light-emitting diodes $LED_i$ of this set $D_i$.

The lower conductive electrode layer 26 is not continuous and, on the contrary, has a pattern guaranteeing the insulation of the other ones of the first lower electrodes of the different sets $D_i$ of light-emitting diodes $LED_i$ with respect to one another and enabling the electrical connection of the electrodes to the first terminals of the electronic components $16_i$ through the vias $25_i$.

As represented in FIGS. 3 and 6, an electrically-insulating layer 27 may be interposed between the substrate 11 and the lower conductive electrode layer 26. In particular, the electrically-insulating layer 27 has a pattern for the same reasons as the lower conductive electrode layer 26. The electrically-insulating layer 27 is formed over the first face 12 of the substrate 11 and the lower conductive electrode layer 26 is, in turn, formed over the electrically-insulating layer 27.

For example, each via $25_i$ is obtained by the arrangement of a through passage formed throughout the thickness E of the substrate 11 and opening onto both of its faces 12, 13. Then, this passage is filled with a suitable electrically-conductive material, such as for example highly-doped polycrystalline silicon. Possibly, the walls of the passage may be lined beforehand with an insulating material, such as for example a silicon oxide, in order to electrically insulate the via $25_i$ with respect to the substrate 11 crossing it. Alternatively, it is possible to create vias $25_i$ by ion implantation making the substrate 11 locally electrically-conductive.

Preferably, at the level of each set $D_i$ of light-emitting diodes $LED_i$, the lower conductive electrode layer 26 comprises a nucleation layer or a stacking of nucleation layers formed in a material adapted for growth, over said material, of the semiconductor elements of the light-emitting diodes $LED_i$.

As example, the material composing the nucleation layer may be a nitride, a carbide or a boride of a transition metal of the column IV, V or VI of the periodic table of elements or a combination of these compounds. As example, the nucleation layer may be made of aluminum nitride, aluminum oxide, boron, boron nitride, titanium, titanium nitride, tantalum, tantalum nitride, hafnium, hafnium nitride, niobium, niobium nitride, zirconium, zirconium boride, zirconium nitride, silicon carbide, tantalum nitride and carbide, or magnesium nitride in the form $Mg_xN_y$, where x is equal to about 3 and y is equal to about 2, for example magnesium nitride in the form $Mg_3N_2$. The nucleation layer may be doped with the same type of conductivity as that of the semiconductor elements intended to grow, and have a thickness comprised for example between 1 nm and 200 nm, preferably comprised between 10 nm and 50 nm. The nucleation layer may be composed by an alloy or by a stacking of one or several material(s) mentioned in the list hereinabove.

The optoelectronic device 10 further includes, in each of the embodiments of FIGS. 3 and 6, an insulating layer 28 formed over the lower conductive electrode layer 26 and interposed between the lower conductive electrode layer 26 and the upper conductive electrode layer 15 in order to insulate the first lower electrode and the second upper electrode from one another.

The insulating layer 28 may comprise a first intermediate insulating layer which covers said at least one nucleation layer. It forms a growth mask enabling the epitaxial growth of the first doped portions of the diodes $LED_i$ from through openings locally leading onto the nucleation surfaces. It also participates in ensuring the electrical insulation between the first lower electrodes and the second upper electrodes. The first intermediate insulating layer is made in one or several dielectric material(s) such as, for example, a silicon oxide (for example $SiO_2$) or a silicon nitride (for example $Si_3N_4$ or SiN), or a silicon oxynitride, an aluminum oxide (for example $Al_2O_3$) or a hafnium oxide (for example $HfO_2$). The thickness of the first intermediate insulating layer may be comprised between 5 nm and 1 μm, preferably comprised between 20 nm and 500 nm, for example equal to about 100 nm.

The insulating layer 28 may further include a second intermediate insulating layer which covers the first lower electrodes and participates in ensuring the electrical insulation between the first lower electrodes and the second upper electrodes. It may also cover the growth mask formed by the first intermediate insulating layer. It may come into contact with a lower portion of the second doped portions included in the shells $18_i$. The second intermediate insulating layer may be made of a dielectric material identical to or different from that of the growth mask, such as, for example, a silicon oxide (for example $SiO_2$) or a silicon nitride (for example $Si_3N_4$ or SiN), or a silicon oxynitride, an aluminum oxide (for example $Al_2O_3$) or a hafnium oxide (for example $HfO_2$). The thickness of the second intermediate insulating layer may be comprised between 5 nm and 1 μm, preferably comprised between 20 nm and 500 nm, for example equal to about 100 nm.

Referring to the second embodiment as represented in FIGS. 3 to 5, the second upper electrodes of all of the sets $D_i$ of light-emitting diodes $LED_i$ are electrically connected to one another and in electrical contact with one of the conductive elements $24_i$ in order to be connected to the second terminals of the electronic components through the second conductive means whereas all the first lower electrodes of all of the sets $D_i$ of light-emitting diodes $LED_i$ are insulated from one another and respectively in contact with the first terminal of the corresponding electronic component through the corresponding first conductive means (that is to say in this instance the via $25_i$).

In the case where the diodes are of the core-shell type where the core is N-doped and where the shell is P-doped, then the sets $D_i$ of light-emitting diodes $LED_i$ have a common anode connected to the second terminals of the electronic components of the circuits $16_i$ and the individual cathodes of the sets $D_i$ of light-emitting diodes $LED_i$ are connected respectively to the first terminals of the electronic components of the circuits $16_i$. Conversely, in the case where the diodes are of the core-shell type where the core is P-doped and where the shell is N-doped, then the sets $D_i$ of light-emitting diodes $LED_i$ have a common cathode connected to the second terminals of the electronic components of the circuits $16_i$ and the individual anodes of the sets $D_i$ of light-emitting diodes $LED_i$ are connected respectively to the first terminals of the electronic components of the circuits $16_i$.

In the configuration of FIG. 3, each of the conductive elements $24_i$ is formed by a via formed through the substrate 11 in a manner identical to the vias $25_i$. The conductive elements $24_i$ are electrically-insulated from one another and are insulated with respect to the different first portions $14'_i$ of the substrate 11 and with respect to the different vias $25_i$. In this second embodiment where the first lower electrode of each set $D_i$ of light-emitting diodes $LED_i$ is in contact with the first conductive means (that is to say herein with the corresponding via $25_i$) of this set $D_i$, the second upper electrode of each set $D_i$ of light-emitting diodes $LED_i$ is electrically connected to a corresponding conductive element $24_i$. More specifically, the conductive elements $24_i$ are in contact with the conductive layer 22 through a hole formed throughout the thickness of the stacking formed by the upper conductive electrode layer 15, the insulating layer 28, the lower conductive electrode layer 26 and the electrically-insulating layer 27, this hole opening onto the first face 12 of the substrate 11.

In contrast with the second embodiment of FIGS. 3 to 5, referring to the third embodiment as represented in FIGS. 6 and 7, the first lower electrodes of all of the sets $D_i$ of light-emitting diodes $LED_i$ may be electrically connected to one another and in electrical contact with one of the conductive elements $24_i$ in order to be connected to the second terminals of the electronic components through the second conductive means whereas all the second upper electrodes of all of the sets $D_i$ of light-emitting diodes LED; are insulated from one another and respectively in contact with the first terminal of the corresponding electronic component through the corresponding first conductive means (that is to say in this instance the via $25_i$).

In the case where the diodes are of the core-shell type where the core is N-doped and where the shell is P-doped, then the sets $D_i$ of light-emitting diodes $LED_i$ have a common cathode connected to the second terminals of the electronic components of the circuits $16_i$ and the individual anodes of the sets $D_i$ of light-emitting diodes $LED_i$ are connected respectively to the first terminals of the electronic components of the circuits $16_i$. Conversely, in the case where the diodes are of the core-shell type where the core is P-doped and where the shell is N-doped, then the sets $D_i$ of light-emitting diodes $LED_i$ have a common anode connected to the second terminals of the electronic components of the circuits $16_i$ and the individual cathodes of the sets $D_i$ of light-emitting diodes $LED_i$ are connected respectively to the first terminals of the electronic components of the circuits $16_i$.

In the configuration of FIG. 6, each of the conductive elements $24_i$ is formed through the substrate 11 by a via formed in a manner identical to the vias $24_i$. The conductive elements $24_i$ of the substrate 11 are electrically-insulated from one another and are insulated with respect to the different first portions $14'_i$ of the substrate 11 and with respect to the different vias $25_i$. In this third embodiment where the second upper electrode of each set $D_i$ of light-emitting diodes $LED_i$ is in contact with the first conductive means (that is to say, in this instance, with the corresponding via $25_i$) of this set $D_i$, the first lower electrode of each set $D_i$ of light-emitting diodes $LED_i$ is electrically connected to a corresponding conductive element $24_i$. More specifically, the conductive elements $24_i$ are in contact with the lower conductive electrode layer 26 through a hole crossing the thickness of the electrically-insulating layer 27, this hole opening onto the first face 12 of the substrate 11.

FIGS. 4 and 7 show that, for each set $D_i$ of light-emitting diodes $LED_i$, the first conductive means (herein the via $25_i$) which connects the first terminal of the electronic component arranged on the side of the second face 13 and one amongst the first and second electrodes, both arranged on the side of the first face 12, may be disposed at the corner of each sub-pixel. By contrast, FIG. 5 shows that this first conductive means (that is to say, in this instance, the via $25_i$) may alternatively be arranged at the center of each sub-pixel. For better understanding, the special feature about FIGS. 4 and 5 lies in that each of them illustrates the situation before the formation of the second upper electrodes, and even before the formation of the insulating layer 28. On the contrary, FIG. 7 illustrates the situation after the formation of the second upper electrodes, these then being individual because it is actually the cathode (constituted by the first lower electrode) which is common to the different sets $D_i$ of light-emitting diodes $LED_i$.

Figure 8:
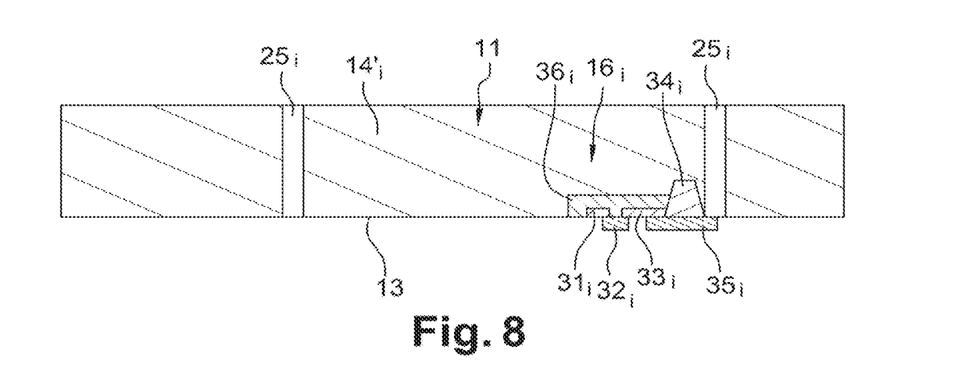
FIG. 8 represents, in partial sectional view, a first example of arrangement of the electronic component used in the second and third embodiments.

FIG. 8 represents in details, in the particular case where the substrate 11 is semiconductor or electrically-insulating, a possible way for achieving the connection between the via $25_i$ and the drain $33_i$ of a transistor constitutive of the electronic component arranged on the side of the rear face 13, typically by the formation of a connection $35_i$, for example made of a silicide such as titanium silicide, cobalt silicide, nickel silicide, platinum silicide or tungsten silicide, connecting the via $25_i$ to the drain $33_i$. This transistor is quite advantageously included within the thickness E of the substrate 11, on the side of the second face 13 opposite to the first face 12 over which the light-emitting diodes $LED_i$ are arranged, by being at least partially, or preferably totally, housed within box $23_i$ formed in the substrate 11 on the side of the second face 13, this box $23_i$ opening outwards of the substrate 11 in order to facilitate the execution of the steps of forming the electronic component. The transistor may also comprise a gate $32_i$, a source $31_i$ and an insulating box $36_i$ and be connected to other electronic elements constituting the control electronics. The insulating box $36_i$ is formed in a material doped between $1*10^{16}$ atoms/cm$^3$ and $3*10^{17}$ atoms/cm$^3$. The source $31_i$ and the drain $33_i$ are also doped, typically between $1*10^{18}$ atoms/cm$^3$ and $2*10^{20}$ atoms/cm$^3$. The drain $33_i$ and the insulating box $36_i$ of said transistor may be insulated from the via $25_i$ by an insulating trench $34_i$ (commonly called «Shallow Trench Isolation» or STI). In this case, the silicide covers the STI so as to enable an electrical connection between the drain $33_i$ of said transistor and the via $25_i$. The gate length may be determined according to the acceptable leakage level. The gate width may be determined according to the acceptable current. As example, the gate width is smaller than 1 micron so as to make a 40 μA current flow in sub-pixels having a 30 microns step. The thickness of the insulator intended to encapsulate the individual electronic circuits on the side of the second face 13 may be determined according to an acceptable field value.

Figure 9:
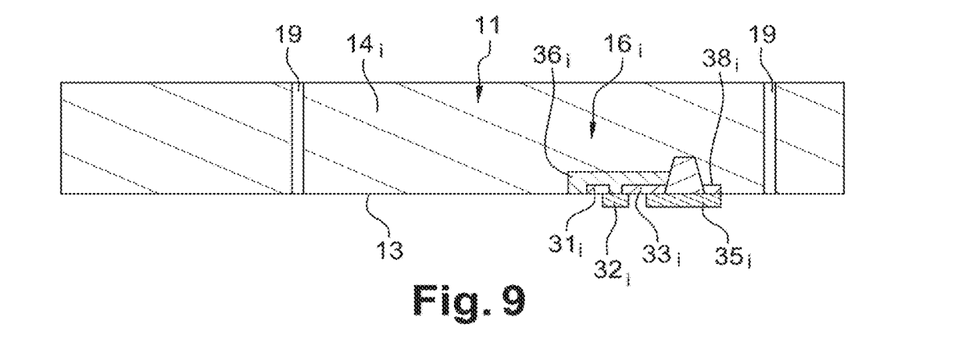
FIG. 9 represents, in partial sectional view, a second example of arrangement of the electronic component used in the first embodiment.

By contrast, in the particular case where the substrate 11 is electrically-conductive, FIG. 9 illustrates the presence of a contact resumption element $38_i$ between the connection $35_i$ and the substrate 11.

Preferably, the optoelectronic device 10 includes an encapsulation layer 29 formed over the second upper electrodes and wrapping all of the light-emitting diodes $LED_i$ on the side opposite to the substrate 11 in order to protect them. Preferably, the encapsulation layer 29 is formed so as to cover the entire structure. The material of the encapsulation layer 29 may be transparent.

The optoelectronic device 10 may possibly include one or several color converter(s), not represented, arranged in the encapsulation layer 29 or on the latter. A given color converter may be positioned vertically above a set $D_i$ of light-emitting diodes $LED_i$ in order to convert the color of the light emitted by the light-emitting diodes $LED_i$. As example, a set $D_i$ of light-emitting diodes $LED_i$, constitutive of a given sub-pixel, comprises light-emitting diodes $LED_i$ adapted to intrinsically emit a blue color, the color converter associated to this set $D_i$ then serving in converting this blue color into a red color or into a green color intended to be emitted out of the optoelectronic device 10 through the upper face opposite to the substrate 11.

In general, the optoelectronic device 10 comprises an optoelectronic circuit 40 including distinct elementary electronic circuits $40_i$ connected together, where each elementary electronic circuit $40_i$ comprises:
  one of the sets $D_i$ of light-emitting diodes $LED_i$,
  a control electronic circuit $16_i$ ensuring control of the light-emitting diodes $LED_i$ of this set of light-emitting diodes, this control electronic circuit $16_i$ being arranged on the side of the second face 13 of the substrate 11 and the electronic component of this set of light-emitting diodes forming an integral part of said control electronic circuit $16_i$.

In particular, the control electronic circuit $16_i$ of the light-emitting diodes $LED_i$ of a set $D_i$ of light-emitting diodes is configured so as to fill at least one of the following functions: control of the power supply of the light-emitting diodes of this set, a protection of the light-emitting diodes of this set against electrostatic discharges, a memory, a detection of the temperature of the light-emitting diodes of this set. The nature and the design of each control electronic circuit $16_i$ are not restrictive with regards to the field of application of the principles described in the present document.

As example, the electronic component is selected from the group comprising a diode, a Zener diode, an avalanche diode, a bipolar transistor, a metal-oxide-semiconductor field-effect transistor, a resistor, a metal-oxide-semiconductor capacitor, a metal-insulator-metal capacitor, a thyristor, a varactor, a volatile memory and a non-volatile memory.

In order to reduce the bulk of the optoelectronic device 10 along the thickness E thereof, the substrate 11 preferably delimits, at the level of each first portion $14_i$ of the substrate 11, a box $23_i$, whose conductivity is opposite to that of the substrate 11, formed in the second face 13 and the electronic component is formed within this box $23_i$ so as to be in direct contact with the substrate 11. It is specified that by «opposite conductivity», it should be understood that the box $23_i$ has a modified conductivity with regards to that of the substrate 11. The electronic component housed within the box $23_i$ is contained at least partially, and even preferably entirely, within the thickness E of the substrate 11. In one example, the box $23_i$ is formed in the second face 13 of the substrate 11, the electronic component being formed at least partially within the box $23_i$ so as to form an integral part with a portion of the substrate 11.

It is possible to provide for the electronic components consisting of thin film transistors, known in the concerned field under the name «TFT», or of the «OTFT» type, standing for «Organic Thin Film Transistor». An advantage of OTFT-type transistors is having sub-micron gate lengths compatible with the arrangement of very small pixels with limited parasitic capacitances in order to enable switching at about 10 MHz. Another advantage is that they could be manufactured at very low temperature, typically at about 60° C. An additional advantage is that it is not necessary to use the substrate 11 as an electronics support.

Figure 10:
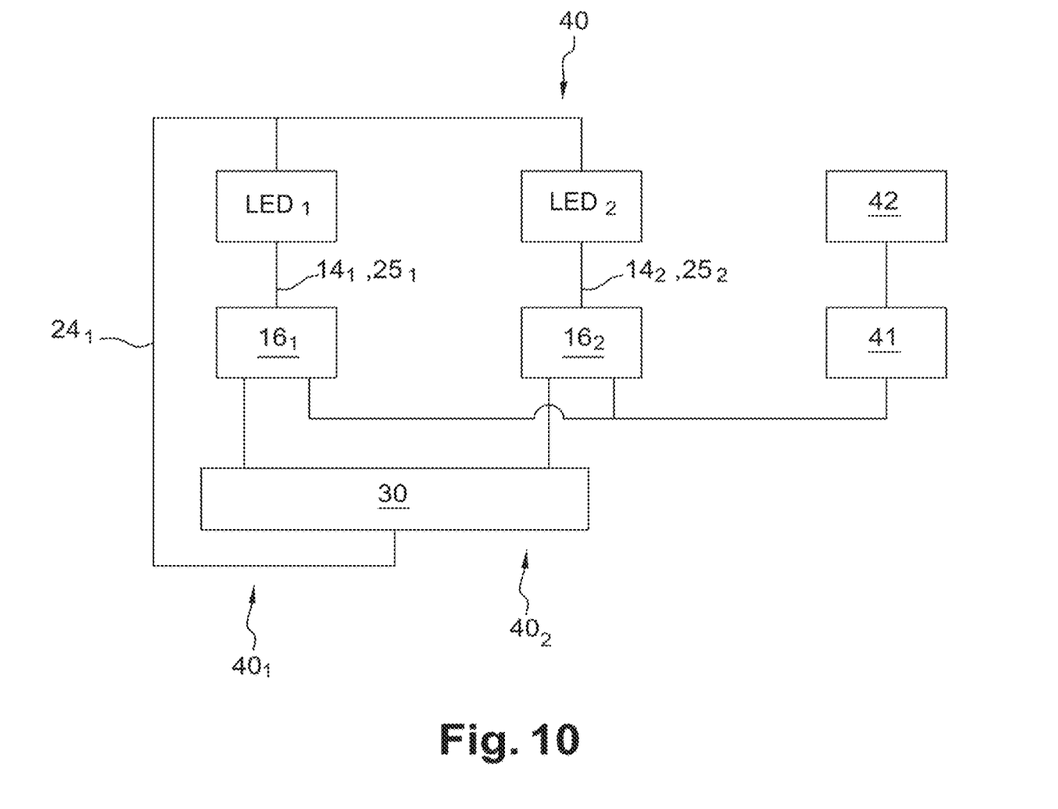
FIG. 10 is a block diagram schematizing an example of an optoelectronic circuit.

FIG. 10 schematically illustrates an example of an optoelectronic circuit 40 in order to clarify the overall understanding for the reader, in the particular case with two distinct elementary electronic circuits $40_1$, $40_2$ connected together. The elementary electronic circuit $40_1$ comprises the set $D_1$ of light-emitting diodes $LED_1$ and the control electronic circuit $16_1$ ensuring control of the light-emitting diodes $LED_1$ of this set $D_1$ of light-emitting diodes $LED_1$. The control electronic circuit $16_1$ is arranged on the side of the second face 13 of the substrate 11 and the electronic component of this set $D_1$ of light-emitting diodes $LED_1$ forming an integral part of the control electronic circuit $16_1$. The elementary electronic circuit $40_2$ comprises the set $D_2$ of light-emitting diodes $LED_2$ and the control electronic circuit $16_2$ ensuring control of the light-emitting diodes $LED_2$ of this set $D_2$ of light-emitting diodes $LED_2$. The control electronic circuit $16_2$ is arranged on the side of the second face 13 of the substrate 11 and the electronic component of this set $D_2$ of light-emitting diodes $LED_2$ forms an integral part of the control electronic circuit $16_2$. The first conductive means associated to the set $D_1$ (corresponding for example to the first portion $14_1$ in the case where the substrate 11 is conductive or to the via $25_1$ in the case where the substrate 11 is semiconductor or electrically-insulating) which is formed through the first portion $14_1$, $14'_1$ ensures electrical connection of one amongst the first and second electrodes of the diodes $LED_1$ to the first terminal of the electronic component of the electronic circuit $16_1$. The second conductive means constituted by the combination of the conductive element $24_1$ and of the conductive layer 30 connects the other one amongst the first and second electrodes of the diodes $LED_1$ to the second terminal of the electronic component of the electronic circuit $16_1$. The first conductive means associated to the set $D_2$ (corresponding for example to the first portion $14_2$ in the case where the substrate 11 is conductive or to the via $25_2$ in the case where the substrate 11 is semiconductor or electrically-insulating) which is formed through the first portion $14_2$, $14'_2$ ensures electrical connection of one amongst the first and second electrodes of the diodes $LED_2$ to the first terminal of the electronic component of the electronic circuit $16_2$. The second conductive means constituted by the combination of the conductive element $24_1$ and of the conductive layer 30 connects the other one amongst the first and second electrodes of the diodes $LED_2$ to the second terminal of the electronic component of the electronic circuit $16_2$. The second terminals of the electronic components of the electronic circuits $16_1$, $16_2$ are connected together via the second conductive means. The electronic circuits $16_1$, $16_2$ are connected to a pilot unit 41 and to a power supply source 42.

An embodiment of a method for manufacturing the optoelectronic device 10 may comprise the following steps, which are not necessarily consecutive:
  (a) providing the substrate 11 delimiting the first face 12 and a second face 13 opposite to one another along the thickness E of the substrate 11;
  (b) forming the plurality of sets $D_i$ of light-emitting diodes $LED_i$ where the light-emitting diodes $LED_i$ of a given set $D_i$ are electrically associated together, during which step (b) the formation of each set $D_i$ of light-emitting diodes $LED_i$ comprises the formation of a plurality of light-emitting diodes $LED_i$, on the side of the first face 12 of the substrate 11, over the corresponding first portion $14_i$, $14'_i$ of the substrate 11, the formation of each light-emitting diode $LED_i$ comprising a step of forming semiconductor elements including a first doped portion, an active portion and a second doped portion;

(c) forming, for each set $D_i$ of light-emitting diodes $LED_i$, a first lower electrode in contact with the first doped portions of all of the light-emitting diodes $LED_i$ of this set $D_i$;

(d) forming, for each set $D_i$ of light-emitting diodes $LED_i$, a second upper electrode in contact with the second doped portions of all of the light-emitting diodes $LED_i$ of this set $D_i$, the second upper electrode being electrically-insulated with respect to the first lower electrode and comprising a step of forming the upper conductive electrode layer 15 covering at least one portion of each light-emitting diode $LED_i$ of this set $D_i$ so as to contact with each light-emitting diode $LED_i$;

(e) forming the electronic component of the electronic circuit $16_i$ in the first portion $14_i$, $14'_i$ of the substrate 11, on the side of the second face 13 of the substrate 11;

(f) supplying the first conductive means formed through the first portion $14_i$, $14'_i$ and which allows electrically connecting the first terminal of the electronic component formed at step (e) to the first lower electrode formed at step (c) or to the second upper electrode formed at step (d), step (f) being carried out so that the first conductive means of a given set $D_i$ of light-emitting diodes $LED_i$ is electrically-insulated from the first conductive means of the other sets $D_i$ of light-emitting diodes $LED_i$.

As it arises from the previous explanations, in the first embodiment of FIGS. 1 and 2, step (f) may consists in the combination of a step (a) where the substrate 11 is conductive or highly-doped semiconductor, of a step (b) where the first doped portions of the light-emitting diodes $LED_i$ are formed over the first face 12 of the substrate 11 and of the implementation of a step of forming the electrically-insulating elements 19 delimiting therebetween, in pairs, the first portions $14_i$, $14'_i$ of the substrate 11.

In particular, the step of forming the electrically-insulating elements 19 may comprise a step of etching, for each electrically-insulating element 19, an opening (for example in the form of a trench as previously described) in the substrate 11. The opening may be formed by any known technique, for example by reactive-ion etching. The depth of the opening is strictly larger than the intended thickness E of the substrate 11 after a thinning step (h) described later on. Afterwards, the step of forming the electrically-insulating elements 19 may comprise a step of filling the previously-etched opening with an electrically-insulating fill material, for example an oxide, in particular silicon oxide, or an insulating polymer. Alternatively, it is possible to provide for covering only the walls of each etched opening with an insulating layer, the remainder of the trench being filled afterwards with a semiconductor or conductive material, for example polycrystalline silicon.

Besides, it is possible to achieve the formation of the second portions $24_i$ thanks to the formation of the electrically-insulating elements 19 as described hereinbefore.

Alternatively, in the second embodiment of FIGS. 3 to 5, as it arises from the previous explanations, step (f) may consist in the combination of a step (c), of a step (b) where the first doped portions of the light-emitting diodes $LED_i$ are formed so as to be in contact with the first lower electrode formed at step (c), and of the formation of the vias $25_i$ in contact with the first lower electrode formed at step (c).

Alternatively, as it arises from the previous explanations, in the third embodiment of FIGS. 6 and 7, step (f) may consist in the combination of step (d), of a step (b) where the second doped portions of the light-emitting diodes $LED_i$ are formed so as to be in contact with the second upper electrode formed at step (d), and of the formation of the vias $25_i$ in contact with the second upper electrode formed at step (d).

The step of forming the vias $25_i$ may be carried out according to any technique known to those skilled in the art. As example, the step of forming the vias $25_i$ comprises, for each via $25_i$, a step of forming a through passage formed in the substrate 11. This passage may be formed by any known technique. The depth of the passage is strictly larger than the intended thickness E of the substrate 11 after the thinning step (h). Afterwards, the step of forming the vias $25_i$ may comprise a step of filling the passage with a suitable electrically-conductive material, such as for example highly-doped polycrystalline silicon. Alternatively, it is possible to provide for covering the walls of the passage beforehand with an insulating material, such as for example a silicon oxide, in order to electrically insulate the via $25_i$ with respect to the substrate 11 crossed thereby.

For the implementation of step (f), the step of forming the vias $25_i$ or the step of forming the electrically-insulating elements 19 may be carried out either at least partially before step (b), or at least partially after step (c) and after step (d).

Preferably, step (e) is carried out at least partially after step (b), in particular because of the thermal constraint related to the growth of the semiconductor elements of the light-emitting diodes $LED_i$.

Preferably, step (e) is carried out at least partially after step (c) and after step (d), in order to avoid the steps of forming the first and second electrodes deteriorating a previously formed electronic component.

As previously indicated, step (a) may possibly comprise a step (h) consisting in reducing the thickness of the substrate 11 in the side opposite to the first face 12, the substrate 11 delimiting, after this step (h), the second face 13 opposite to the first face 12. In other words, it is after step (h) that the substrate 11 actually has the thickness E. Step (h) may be carried out according to any known technique, by mechanical and/or chemical processes possibly followed by a polishing. Preferably, step (h) is carried out after step (e).

Step (e) may comprise a step of forming the box $23_i$ in the second face 13 and then a step of forming the electronic component in the previously-formed box $23_i$.

The method may comprise a step (i) consisting in forming at least one color converter covering the second upper electrode of at least one set $D_i$ of light-emitting diodes $LED_i$. Step (i) may be carried out at least partially before step (h), enabling bonding of the substrate on top of the permanent CCM. Alternatively, step (i) may be carried out at least partially after step (h) in order to be able to increase the thermal budget.

Preferably, the step consisting in forming the electronic component in the first portion $14_i$, $14'_i$ of the substrate 11, on the side of the second face 13 of the substrate 11, is carried out at least partially after step (i), in order to avoid the formation of the color converters deteriorating a previously-formed electronic component.

The optional step (g) consisting in forming the encapsulation layer 29 which covers the second upper electrode is preferably carried out at least partially before step (e).

In the preferred example where the substrate 11 is monolithic and composed by at least one semiconductor material adapted to serve as a base material in the formation of at least one portion of the electronic component of an electronic circuit $16_i$, the method advantageously includes a sub-step (e1) of step (e) consisting in the formation of said at least one portion of said electronic component of an electronic circuit $16_i$ from the semiconductor material of the substrate 11 in the first portion $14_i$, $14'_i$ of the substrate 11, on the side of the second face 13 of the substrate 11.

In one example, said at least one portion of said electronic component of an electronic circuit $16_i$ is an active portion.

In an example of the method, the second face 13 is a free surface at step (e).

The electronic components may be formed by so-called «cold» processes, that is to say step (e) is carried out at a temperature lower than 650° C. Typically, the operations necessary for step (e) may be carried out at a temperature comprised between 250° C. and 650° C., typically about 450° C., avoiding damaging the active portions of the light-emitting diodes $LED_i$ previously formed at step (b). The electronic components may be formed by processes inspired from monolithic CMOS (standing for «Complementary Metal Oxide Semiconductor») techniques or from TFT techniques, or hybrid. The electronic components may also be of the OTFT type so that the operations necessary for step (e) could be carried out almost at ambient temperature, typically in the range of 60° C.

The invention claimed is:

1. An optoelectronic device, comprising:
a monolithic substrate delimiting a first face and a second face opposite to the first face along a thickness of the monolithic substrate, and a plurality of sets of light-emitting diodes wherein light-emitting diodes of a given set of the plurality of sets of light-emitting diodes are electrically associated together and each set of the plurality of sets of light-emitting diodes comprises:
a plurality of light-emitting diodes arranged, on the first face of the monolithic substrate, over a corresponding first portion of the monolithic substrate, each light-emitting diode of the plurality of light-emitting diodes comprising semiconductor elements including a first doped portion, an active portion and a second doped portion;
a first lower electrode in contact with the first doped portions of each light-emitting diode of the set of the plurality of sets of light-emitting diodes;
a second upper electrode in contact with the second doped portions of each light-emitting diode of the set of the plurality of sets of light-emitting diodes, the second upper electrode being electrically-insulated with respect to the first lower electrode and comprising an upper conductive electrode layer covering at least one portion of each light-emitting diode of the set of the plurality of sets of light-emitting diodes so as to contact with each light-emitting diode of the set of the plurality of sets of light-emitting diodes;
an electronic component of an electronic circuit formed in the corresponding first portion of the monolithic substrate, on the second face of the monolithic substrate;
a first conductive means formed through the corresponding first portion and electrically connecting a first terminal of the electronic component to one of the first lower electrode and the second upper electrode, the first conductive means of a given set of the plurality of sets of light-emitting diodes being electrically-insulated from the first conductive means of other sets of the plurality of sets of light-emitting diodes;

wherein the monolithic substrate is composed by at least one semiconductor material adapted to serve as a base material for the formation of at least one portion of the electronic component and the at least one portion of the electronic component is formed from the at least one semiconductor material of the monolithic substrate in the corresponding first portion of the monolithic substrate, on second face of the monolithic substrate.

2. The optoelectronic device according to claim 1, wherein the second face is a free surface.

3. The optoelectronic device according to claim 1, wherein the monolithic substrate delimits a box at each corresponding first portion of the monolithic substrate, the box having a conductivity opposite to that of the monolithic substrate and being formed in the second face of the monolithic substrate, the electronic component being formed at least partially in the box so as to be in direct contact with the monolithic substrate.

4. The optoelectronic device according to claim 1, wherein the at least one portion of the electronic component is an active portion.

5. The optoelectronic device according to claim 1, wherein the electronic component of each set of the plurality of sets of light-emitting diodes comprises a second terminal distinct and insulated from the first terminal and wherein the optoelectronic device comprises a second conductive means connecting the second terminal of the electronic component of each set of the plurality of sets of light-emitting diodes to the other one of the first lower electrode and the second upper electrode.

6. The optoelectronic device according to claim 5, wherein the second conductive means comprises a conductive element crossing the monolithic substrate by extending from the first face to the second face outside the corresponding first portions of each one of the sets of the plurality of sets of light-emitting diodes and a conductive layer arranged on the second face.

7. The optoelectronic device according to claim 6, wherein the conductive element is electrically connected:
to the second upper electrode of the sets of the plurality of sets of light-emitting diodes if the first conductive means of each set of the plurality of sets of light-emitting diodes is in contact with the first lower electrode of the set of the sets of light-emitting diodes;
or to the first lower electrode of the sets of the plurality of sets of light-emitting diodes if the first conductive means of each set of the plurality of sets of light-emitting diodes is in contact with the second upper electrode of the set of the sets of light-emitting diodes.

8. The optoelectronic device according to claim 1, wherein the optoelectronic device comprises an optoelectronic circuit including distinct elementary electronic circuits connected together, wherein each elementary electronic circuit comprises, on the one hand, one of the sets of plurality of sets of light-emitting diodes and, on the other hand, a control electronic circuit ensuring control of the light-emitting diodes of the one of the sets of the plurality of sets of light-emitting diodes, the control electronic circuit being arranged on the second face of the monolithic substrate and the electronic component of the one of the sets of the plurality of sets of light-emitting diodes forming an integral part of the control electronic circuit.

9. The optoelectronic device according to claim 8, wherein the control electronic circuit of the light-emitting diodes of one of the sets of the plurality of sets of light-emitting diodes is configured so as to fill at least one of the following functions: control of a power supply of the light-emitting diodes, a protection of the light-emitting diodes against electrostatic discharges, a memory, a detection of a temperature of the light-emitting diodes.

10. The optoelectronic device according to claim 1, wherein the electronic component is selected from the group comprising a diode, a Zener diode, an avalanche diode, a bipolar transistor, a metal-oxide-semiconductor field-effect transistor, a resistor, a metal-oxide-semiconductor capacitor, a metal-insulator-metal capacitor, a thyristor, a varactor, a volatile memory and a non-volatile memory.

11. The optoelectronic device according to claim 1, wherein the upper conductive electrode layer is formed in a material at least partially transparent to light emitted by the light-emitting diodes covered by the upper conductive electrode layer.

12. The optoelectronic device according to claim 1, wherein at a level of each set of the plurality of sets of light-emitting diodes, the second upper electrode comprises a conductive layer covering at least one portion of the upper conductive electrode layer and arranged around the plurality of light-emitting diodes.

13. The optoelectronic device according to claim 1, wherein the semiconductor elements of the plurality of light-emitting diodes of each set of the plurality of sets of light emitting diodes have a wire-like, conical or frustoconical shape.

14. The optoelectronic device according to claim 1, wherein at a level of each set of the plurality of sets of light-emitting diodes, the corresponding first portion of the monolithic substrate constitutes the first lower electrode and the first conductive means, the first face of the monolithic substrate being in contact with the first doped portions of the plurality of light-emitting diodes of the set of the plurality of sets of the light-emitting diodes and the electronic component being in contact with the monolithic substrate at a level of the second face so that an electrical connection between the first terminal of the electronic component and the first doped portions of the plurality of light-emitting diodes of the set of the plurality of sets of the light-emitting diodes is ensured by the corresponding first portion.

15. The optoelectronic device according to claim 1, wherein the first conductive means of a given set of the plurality of sets of light-emitting diodes which connects one of the first lower electrode and the second upper electrode to the first terminal of the electronic component of the given set is electrically-insulated from the monolithic substrate and comprises an electrically-conductive via extending from the second face up to the first face of the monolithic substrate and electrically connected to the one of the first lower electrode and the second upper electrode to which the first conductive means is connected.

16. The optoelectronic device according to claim 15, wherein for each set of the plurality of sets of light-emitting diodes, the first lower electrode comprises at least one lower conductive electrode layer formed on the first face of the monolithic substrate and in contact with the first doped portions of the plurality of light-emitting diodes of the set of the plurality of sets of the light-emitting diodes.

17. A method for manufacturing an optoelectronic device comprising the following steps of:
(a) providing a monolithic substrate delimiting a first face and a second face opposite to first face along a thickness of the monolithic substrate;
(b) forming a plurality of sets of light-emitting diodes wherein a plurality of light-emitting diodes of a given set of the plurality of sets of light-emitting diodes are electrically associated together, during which step (b) the formation of each set of the plurality of sets of light-emitting diodes comprises the formation of a plurality of light-emitting diodes, on the first face of the monolithic substrate, over a corresponding first portion of the monolithic substrate, the formation of each of the plurality of light-emitting diodes comprising a step of forming semiconductor elements including a first doped portion, an active portion and a second doped portion;
(c) forming, for each set of the plurality of sets of light-emitting diodes, a first lower electrode in contact with the first doped portions of the plurality of light-emitting diodes of the set of the plurality of sets of the light-emitting diodes;
(d) forming, for each set of the plurality of sets of light-emitting diodes, a second upper electrode in contact with the second doped portion of the plurality of light-emitting diodes of the set of the plurality of sets of the light-emitting diodes, the second upper electrode being electrically-insulated with respect to the first lower electrode and comprising a step of forming an upper conductive electrode layer covering at least one portion of each light-emitting diode of the plurality of light-emitting diodes of the set of the plurality of sets of the light-emitting diodes so as to contact with each light-emitting diode the plurality of light-emitting diodes of the set of the plurality of sets of the light-emitting diodes;
(e) forming an electronic component of an electronic circuit in the corresponding first portion of the monolithic substrate, on the second face of the monolithic substrate;
(f) supplying a first conductive means formed through the corresponding first portion and adapted to electrically connect a first terminal of the electronic component formed at step (e) to the first lower electrode formed at step (c) or to the second upper electrode formed at step (d), step (f) being carried out so that the first conductive means of a given set of the plurality of sets of light-emitting diodes is electrically-insulated from the first conductive means of other sets of the plurality of sets of light-emitting diodes the monolithic substrate being composed by at least one semiconductor material adapted to serve as a base material for the formation of at least one portion of the electronic component, the method including a sub-step (e1) of step (e) consisting in the formation of the at least one portion of the electronic component from the semiconductor material of the monolithic substrate in the corresponding first portion of the monolithic substrate, on the second face of the monolithic substrate.

18. The method according to claim 17, wherein the at least one portion of the electronic component is an active portion.

19. The method according to claim 17, wherein step (f) is carried out at least partially before step (b).

20. The method according to claim 17, wherein step (f) is carried out at least partially after step (c) and after step (d).

21. The method according to claim 17, wherein step (e) is carried out at least partially after step (b).

22. The method according to claim 17, wherein step (e) is carried out at least partially after step (c) and after step (d).

23. The method according to claim 17, wherein step (a) comprises a step (h) consisting in reducing the thickness of the monolithic substrate on the second face opposite to the first face, the monolithic substrate comprising, after step (h), the second face opposite to the first face and wherein step (h) is carried out before step (e).

24. The method according to claim 17, wherein the method comprises a step (i) consisting in forming at least one color converter covering the second upper electrode of at least one set of the plurality of sets of light-emitting diodes and in that step (e) is carried out at least partially after step (i).

25. The method according to claim 17, wherein the method comprises a step (g) consisting in forming an encapsulation layer covering the second upper electrode and in that step (e) is carried out at least partially after step (g).

26. The method according to claim 17, wherein step (e) is carried out at a temperature lower than 650° C.

27. The method according to claim 17, wherein the second face is a free surface at step (e).

* * * * *